(12) United States Patent
Pelli et al.

(10) Patent No.: US 7,522,002 B2
(45) Date of Patent: Apr. 21, 2009

(54) BIASING CURRENT TO SPEED UP CURRENT MIRROR SETTLING TIME

(75) Inventors: Gabriele Pelli, Mortara (IT); Lorenzo Bedarida, Vimercate (IT); Massimiliano Frulio, Milan (IT); Andrea Bettini, Cavenago Brianza (IT)

(73) Assignee: Atmel Corporation, San Jose, CA (US)

( * ) Notice: Subject to any disclaimer, the term of this patent is extended or adjusted under 35 U.S.C. 154(b) by 82 days.

(21) Appl. No.: 11/619,729

(22) Filed: Jan. 4, 2007

(65) Prior Publication Data

US 2008/0164948 A1    Jul. 10, 2008

(51) Int. Cl.
H03F 3/04    (2006.01)
(52) U.S. Cl. ........................................ 330/288
(58) Field of Classification Search ............... 330/288; 323/315, 316; 327/538, 543
See application file for complete search history.

(56) References Cited

U.S. PATENT DOCUMENTS

| | | | |
|---|---|---|---|
| 4,147,971 A | 4/1979 | Price | |
| 4,405,916 A | 9/1983 | Hornak et al. | |
| 4,647,840 A | 3/1987 | Hiyama et al. | |
| 4,958,123 A | 9/1990 | Hughes | |
| 5,432,478 A | 7/1995 | Gilbert et al. | |
| 5,493,533 A | 2/1996 | Lambrache | |
| 5,691,720 A | 11/1997 | Wang et al. | |
| 5,864,228 A | 1/1999 | Brown et al. | |
| 5,936,460 A * | 8/1999 | Iravani | 327/543 |
| 5,990,710 A | 11/1999 | Ngo et al. | |
| 6,066,944 A | 5/2000 | Sakurai | |
| 6,191,645 B1 | 2/2001 | Digele | |
| 6,472,858 B1 | 10/2002 | Tanase | |
| 6,566,851 B1 | 5/2003 | Schuelke et al. | |
| 6,686,957 B1 | 2/2004 | Johnson et al. | |
| 6,707,715 B2 | 3/2004 | Michael et al. | |
| 6,717,471 B2 * | 4/2004 | Arayashiki et al. | 330/285 |
| 6,819,165 B2 * | 11/2004 | Ho et al. | 327/541 |
| 6,831,498 B2 | 12/2004 | Marsh | |
| 6,975,473 B2 | 12/2005 | Ngo | |
| 2003/0184274 A1 | 10/2003 | Comer et al. | |
| 2005/0266820 A1 | 12/2005 | Behzad et al. | |

FOREIGN PATENT DOCUMENTS

WO    WO 2008085781 A1    7/2008

* cited by examiner

*Primary Examiner*—Khanh V Nguyen
(74) *Attorney, Agent, or Firm*—Schwegman, Lundberg & Woessner, P.A.

(57) ABSTRACT

A current mirror circuit includes a first current-mirror transistor coupled to a second current-mirror transistor. A load is coupled to the second current-mirror transistor. A first current source is coupled to the first current-mirror transistor to cause a bias current to flow through the first current-mirror transistor and a second current source is coupled to the second current-mirror transistor and in parallel with the load to shunt the bias current away from the load.

23 Claims, 10 Drawing Sheets

FIGURE 11C

BIASING CURRENT TO SPEED UP CURRENT MIRROR SETTLING TIME

BACKGROUND OF THE INVENTION

1. Field of the Invention

The present invention relates to current mirror circuits. More particularly, the present invention relates to a current-mirror circuit including a biasing current to speed up current-mirror settling time

2. The Prior Art

Figure 1A:
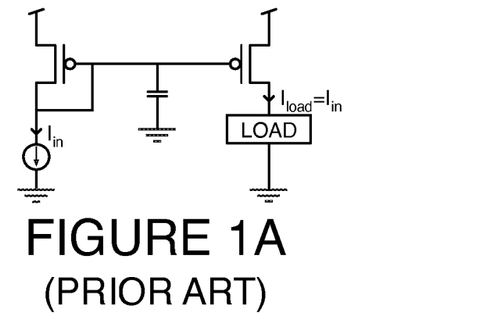
FIGS. 1A and 1B, are, respectively, schematic diagrams of simple prior-art p-channel and n-channel current mirrors, respectively.
Figure 1B:
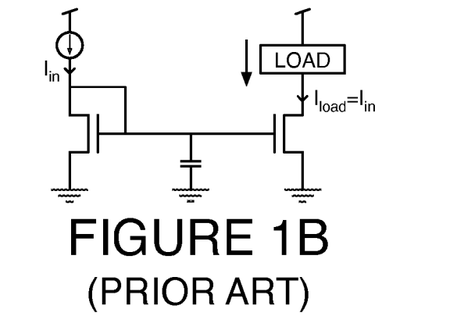

Simple prior-art current-mirror circuits are shown in FIGS. 1A and 1B. The circuit of FIG. 1A transfers the input current $I_{in}$ to a load circuit by two p-channel mirror-connected transistors. The current generator schematically represents any generic current source that supplies the input current to the mirror connected transistors, and the capacitance represents any possible load capacitance associated with the node connecting together the gates of the two transistors. In FIG. 1B, an equivalent circuit using two n-channel mirror-connected transistors is shown. The two circuits are equivalent from an operation point of view. By changing the ratio of the dimensions of the mirror-connected transistors dimensions ratio, the steady-state output current can be made to be greater or smaller than the input current.

Typically, two constraints may be considered as critical for a current mirror circuit: the precision with which the output current is equal to the desired value, and the speed with which it reaches the final value once the circuit is powered on. Once the circuit is powered on, $I_{out}$ does not reach its desired value until all the circuit internal nodes reach their steady-state operating conditions. The time needed by currents and voltages to achieve their final value is usually referred to as voltage or current settling time. During the transient turn-on period, the node connecting together the gates of the two transistors is driven by the current sunk by the diode-connected transistor. Its behavior is shown in the current-to-voltage characteristic of FIG. 2. Once this circuit is powered on, the node connecting together the gates of the two transistors starts, for example, from GND and reaches its steady state voltage value for which $I_{DS}=I_{in}$. Looking at the transistor characteristic, this means that the diode-connected transistor reaches its operating point A from the right (for example, from $V_{DS}=V_{DD}$).

Figure 2:
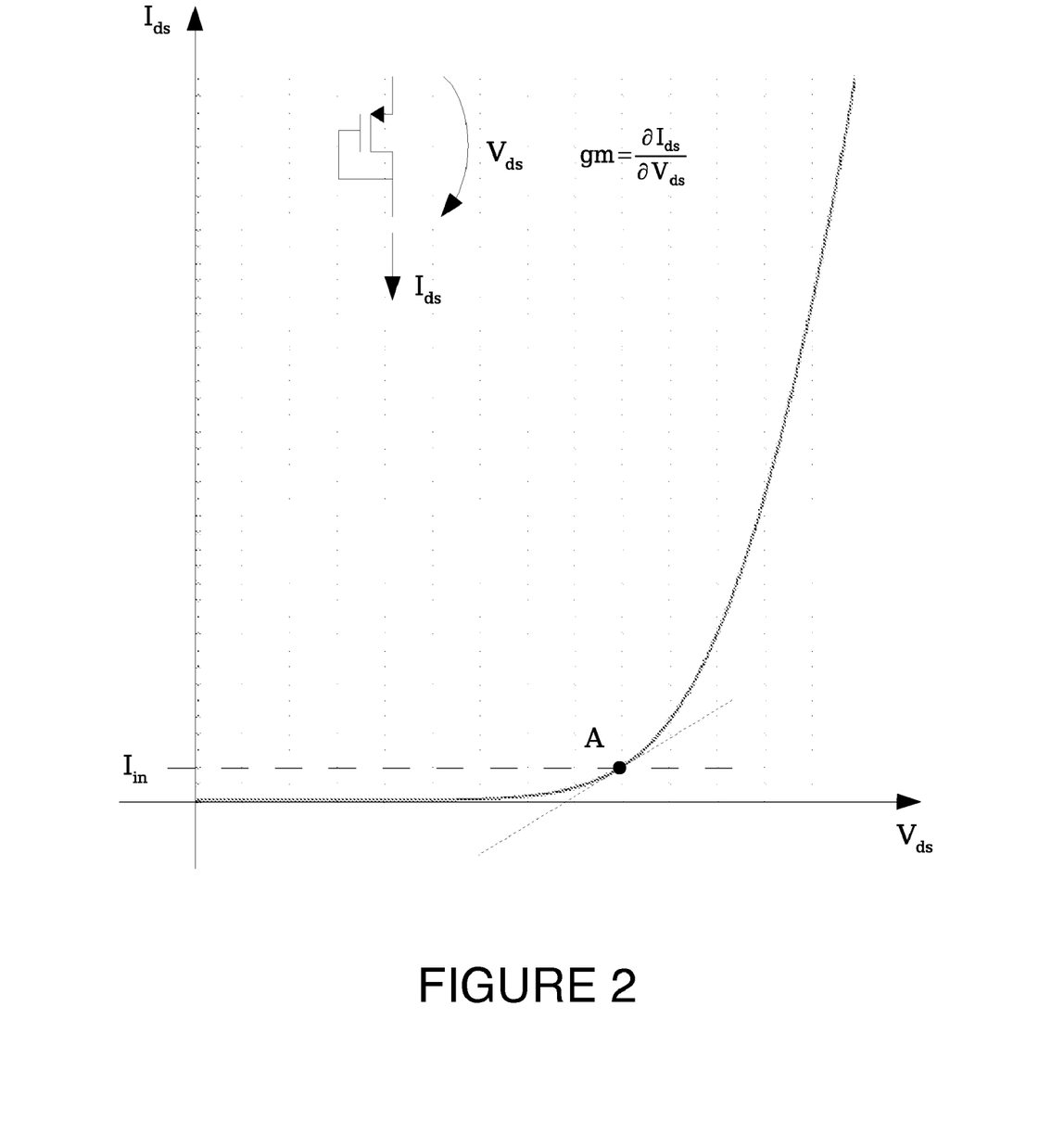
FIG. 2 is a graph of IV characteristic of transistors such as used in the current mirrors of FIGS. 1A and 1B.

As shown in FIG. 2, the diode-connected transistor sinks more current than $I_{in}$ until its gate to source voltage (also drain to source voltage) is greater than its final value. This extra current charges node connecting together the gates of the two transistors close to its steady state voltage value, in a time depending on the dimensions (W and L) of the diode-connected transistor; the larger is it, the greater is the current supplied to the node and, thus, the shorter is the time with which its voltage value approaches to the point A. For this reason, typically, a large diode-connected transistor is chosen. Once the node voltage is about to definitively reach its final value, the transistor current diminishes together with the transistor transconductance (that is, the curve slope, shown in FIG. 2), which indicates the strength with which the diode-connected transistor drives the node up to its steady state value.

A critical situation is that in which a very low current $I_{in}$ has to be supplied by a large diode-connected transistor in the steady-state condition. In such a case, the point A could be quite close to the transistor turning off condition. This means that it reaches its steady-state condition in a very slow manner, in particular, in a noticeably asymptotic manner. As a consequence, this last transient phase could take most of the total settling time.

The purpose of current-mirror circuits is to transfer, in the fastest possible way, the precise value of the current $I_{in}$ to the output node. Such precision is obtained only once the operating point of the diode-connected transistor is at point A in the curve of FIG. 2. As a consequence, the entire asymptotic transient phase must be finished to obtain such a precision. It is important to emphasize that, for the reasons given above, a critical situation could occur independently of the value of the load capacitance coupled with the gate of the mirror-connected transistors even if the capacitance of the node is small. In fact, a very low current $I_{in}$ supplied to a large diode-connected transistor can result a very long asymptotic behavior of the node since the operating point is close to the turn-off point of the transistor.

Thus, for the current-mirror circuits of FIGS. 1A and 1B, employing a larger diode-connected transistor speeds up the initial transient phase where the drain-to-source voltage is far from the turn-off point, but slows down the subsequent transient period where the drain-to-source voltage value is about to reach a steady-state value that is close to its turn-off point.

Figure 3A:
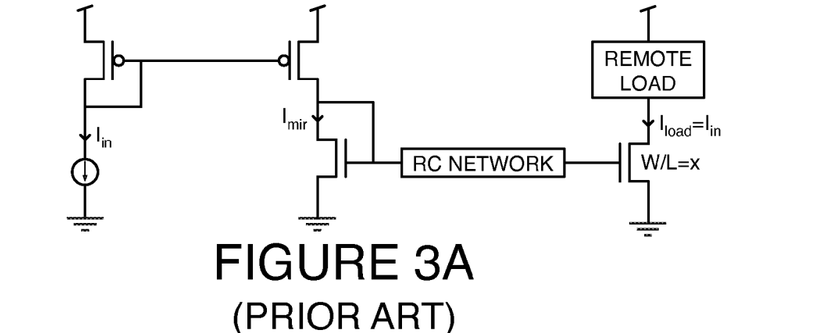
FIGS. 3A through 3C are schematic diagrams of other prior-art p-channel and n-channel current mirrors.

One way to transfer the input current to a remote load circuit is to use a chain of mirror-connected transistors like those shown in the circuit of FIG. 3A. As shown in FIG. 3A, the circuit generates a current supplied to a remote load circuit. Those of ordinary skill in the art will observe that this current-mirror chain is practically obtained merging together a p-channel and an n-channel current mirror like those shown in FIGS. 1A and 1B. To simplify the analysis, the conditions $I_{out}=I_{in}$ and $I_{mirr}=I_{in}$ are considered. For several reasons, the current-generator portion of the circuit and the p-channel transistors and the diode-connected n-channel transistor could be at a very different chip location than that of the load circuit and the driven n-channel transistor. Accordingly, the interconnect path may generally be modeled by an RC network.

The output-current settling time could be quite long, for example, if a long interconnect path links the two sides of the circuit and a low current drives the RC network. The circuit in FIG. 3B attempts to speed up the transient circuit behavior to solve this problem by sizing the driven p-channel transistor and the diode-connected n-channel transistor to be m times larger so that the current driving the RC network is m times greater. However, sizing the driven p-channel transistor to be m times larger also makes its gate capacitance m times larger, increasing the gate voltage settling time. FIG. 4 shows the output current curves of the circuits of FIGS. 3A and 3B. As shown in FIG. 4, choosing the right value for m, results in an output current settling time for the circuit of FIG. 3B circuit that is less than the circuit of FIG. 3A.

Figure 3B:
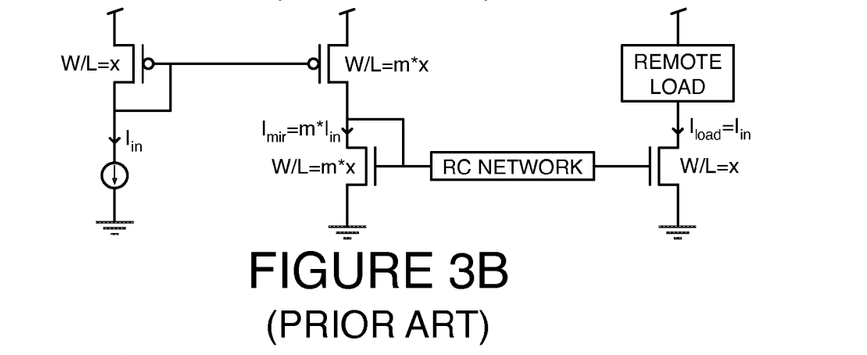
Figure 3C:
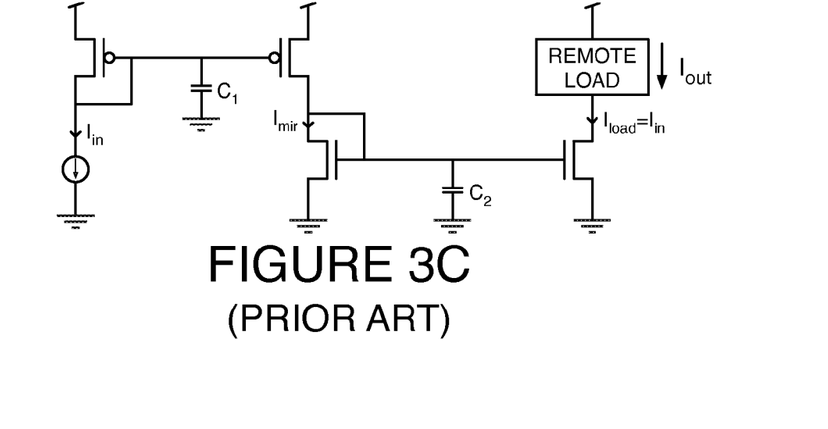
Figure 4:
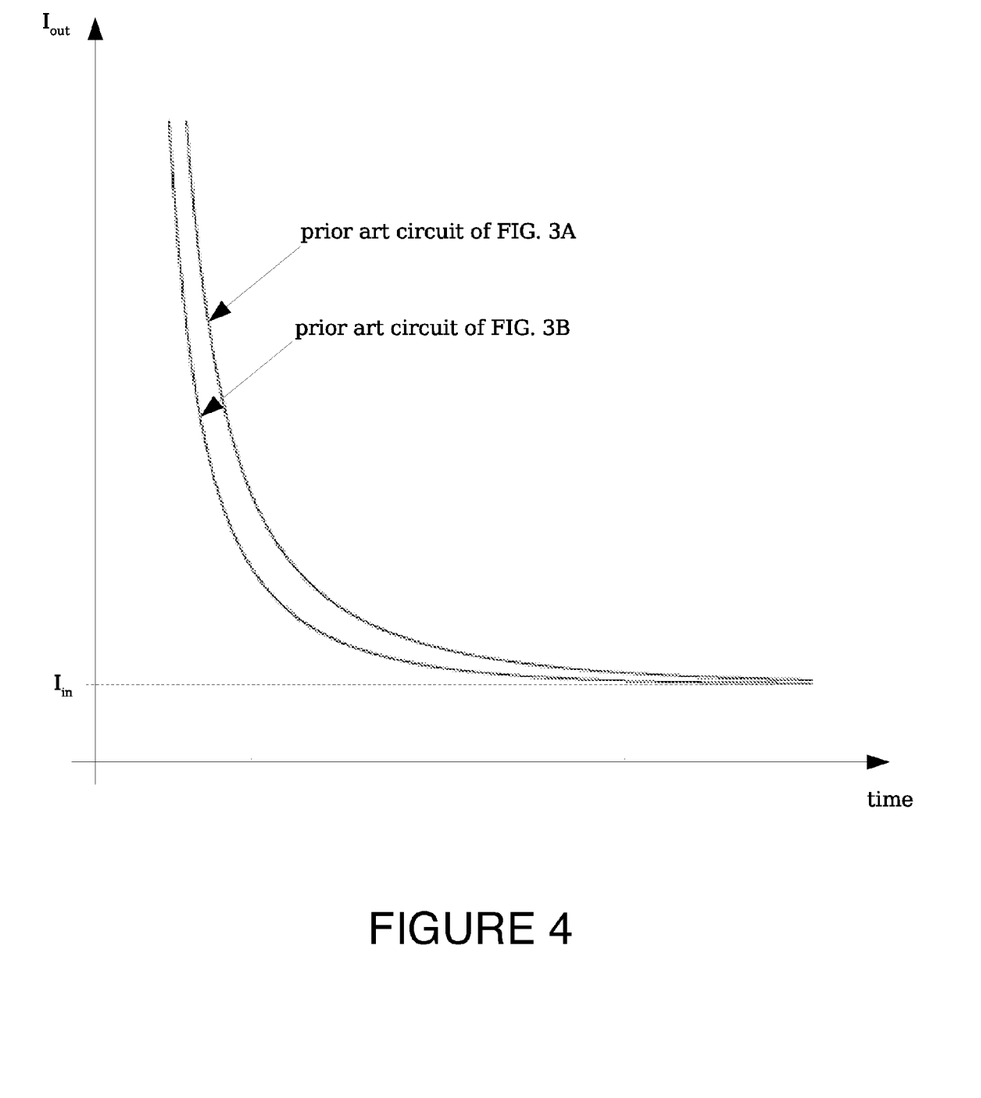
FIG. 4 is a graph of output-current-vs-time characteristics of the current mirrors of FIGS. 3A and 3B.

The circuit shown in FIG. 3C is a more general version of the circuits of FIGS. 3A and 3B in which the two capacitances represent any possible load capacitance respectively on the p-channel and n-channel gate nodes. For example, the capacitances $C_1$ and $C_2$ could represent, respectively, the p-channel transistor gate capacitance, and the capacitance of the RC network. Depending on the value of $C_1$ and $C_2$, and on the current supplied to them, the circuit speed could be limited by the voltage settling time of either the $C_1$ node or the $C_2$ node.

BRIEF DESCRIPTION OF THE INVENTION

According to the present invention, a method of operating a current mirror circuit including a diode-connected transistor driving a driven transistor forcing current through a load includes causing a bias current to flow in the diode-connected transistor and subtracting the bias current from the current flowing from the driven transistor into the load. The method may be practiced on one or more stages of a multi-stage current mirror circuit.

A current mirror circuit includes a first current-mirror transistor coupled to a second current-mirror transistor. A load is coupled to the second current-mirror transistor. A first current source is coupled to the first current-mirror transistor to cause a bias current to flow through the first current-mirror transistor and a second current source is coupled to the second current-mirror transistor and in parallel with the load to shunt the bias current away from the load. Multiple stages of current mirror circuits having this arrangement may be provided, and the sizes of the component transistors need not be the same.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention is useful for any current-mirror circuit formed from simpler p-channel and n-channel current-mirror circuits, and speeds up the settling time for a wide variety of such circuits, from the simpler to the complex.

The present invention operates by speeding up the output-current settling time, in particular, improving the last transient phase behavior of the prior-art current-mirror circuits.

Figure 5:
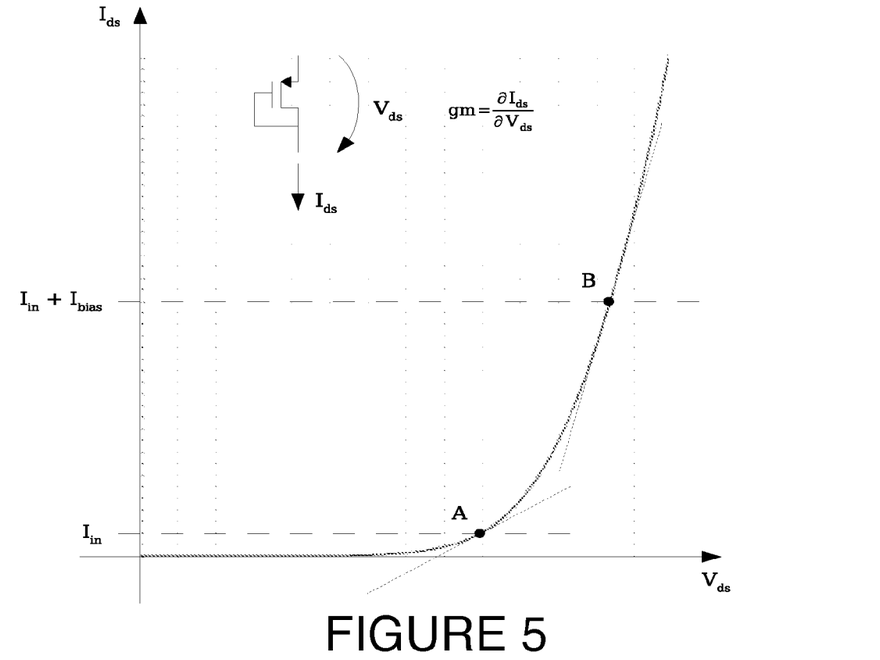
FIG. 5 is a graph illustrating the principles of the present invention.

As previously noted, a significant issue of prior-art current-mirror circuits involves the operating point of the diode-connected transistor. If this transistor is designed to be larger to allow a fast initial capacitive node charging, the operating current $I_{in}$ can be too low with respect to its dimensions, thereby biasing it too close to its turn-off point. Referring to the transistor characteristic of FIG. 2, a possible solution could be to shift the steady-state operating point of the diode-connected transistor to a point such as point B shown in FIG. 5 far enough from its turn-off point. In order to obtain this, the diode-connected transistor must be biased at a higher drain-to-source current value. If, for example, an additional current $I_{bias}$ is added, the total current becomes ($I_{in}+I_{bias}$) to which its operating point becomes shifted. To compensate for this additional current, a current source must be added to the load to shunt away the additional current $I_{bias}$ so that it does not flow through the load.

Figure 6A:
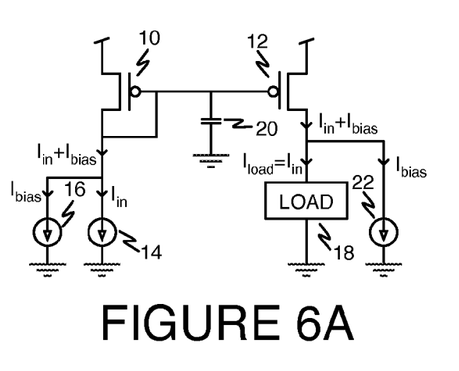
FIGS. 6A and 6B are schematic diagrams of p-channel and n-channel current-mirror circuits, respectively, formed using the principles of the present invention.

Referring now to FIG. 6A, a first current-mirror circuit employing the principles of the present invention is shown. The current mirror circuit includes diode-connected p-channel transistor 10 and driven p-channel transistor 12. A current source 14 generates the current $I_{in}$ that flows through diode-connected transistor 10. A second current source 16 generates an additional current $I_{bias}$ that also flows through diode-connected transistor 10. The total current flowing through diode-connected transistor 10 is therefore $I_{in}+I_{bias}$.

On the load side, the current $I_{in}+I_{bias}$ is mirrored in driven p-channel transistor 12 (assuming that transistors 10 and 12 are sized the same, and so that our target is to have $I_{out}=I_{in}$ quickly) and through load 18. Capacitance 20 represents the capacitance of the node comprising the gates of transistors 10 and 12 and any other connecting structures. Since it is desired that only the output current $I_{out}=I_{in}$ flows through load 18, another current source 22 is provided to conduct a current of magnitude $I_{bias}$ through it and thus shunt that current away from the load 18.

Current source 22 may be identical to current source 16, so that it can more precisely conduct the current having the magnitude $I_{bias}$. Those of ordinary skill in the art will observe that this is a simplification that does not to limit the generality of the present invention since the two bias currents could be chosen to be different due, for example, to some non-idealities of the mirror transistor pair, or for any other reason. In the simple case, the current behavior of the current-mirror circuit of FIG. 6A is $I_{out}=I_{in}+I_{bias}-I_{bias}=I_{in}$.

Figure 6B:
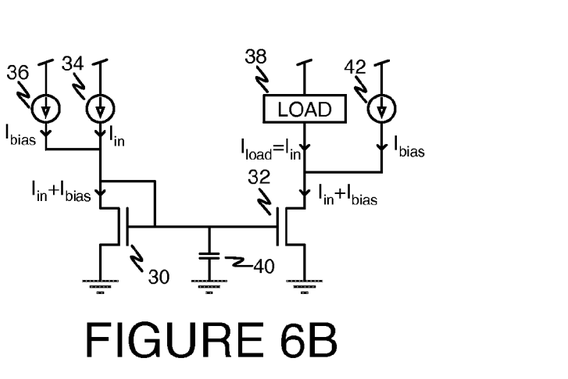

Referring now to FIG. 6B, the principles of the present invention are applied to an n-channel current mirror. The n-channel and the p-channel current mirrors are equivalent from the operation point of view. The current mirror circuit includes diode-connected n-channel transistor 30 and driven n-channel transistor 32. A current source 34 generates the current $I_{in}$ that flows through diode-connected transistor 30. A second current source 36 generates an additional current $I_{bias}$ that also flows through diode-connected transistor 30. The total current flowing through diode-connected transistor 30 is therefore $I_{in}+I_{bias}$.

On the load side of the circuit of FIG. 6B, the current $I_{in}+I_{bias}$ is mirrored in driven transistor 32 (assuming that transistors 30 and 32 are sized the same) and through load 38. Capacitance 40 represents the capacitance of the node comprising the gates of transistors 30 and 32 and any other connecting structures. Since it is desired that only the output current $I_{out}=I_{in}$ flows through load 38, another current source 42 is provided to shunt a current of magnitude $I_{bias}$ through it and thus shunt that current away from the load 38.

Figure 7A:
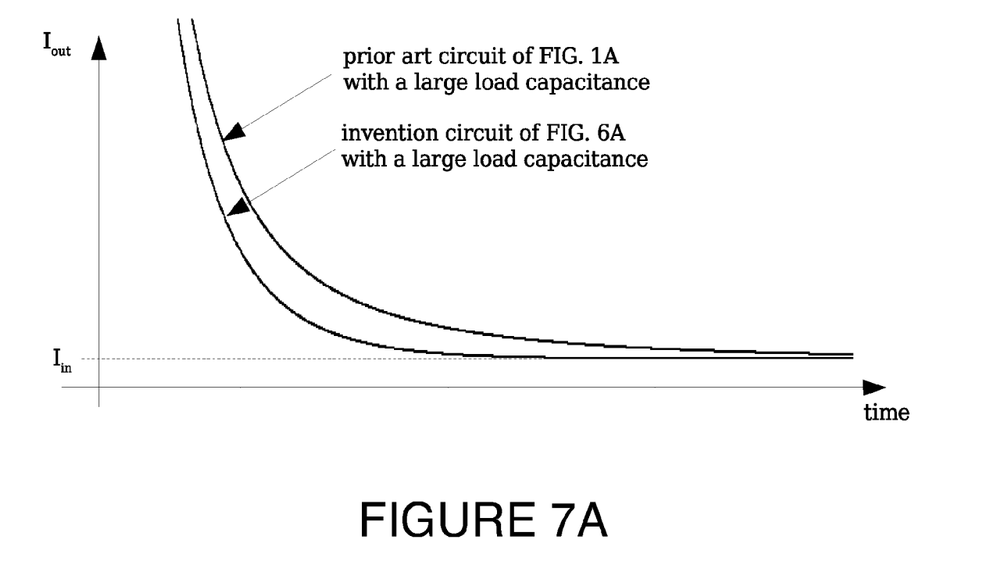
FIGS. 7A and 7B are graphs showing the current settling time improvement obtainable by the circuit of FIG. 6A under two different circuit capacitance conditions.

FIG. 7A shows the output current of the circuit of FIG. 6A, to which a proper bias current $I_{bias}$ is added, compared with the prior-art circuit of FIG. 1A in which no bias current is added. For these results, a large capacitance 20 (e.g., on the order of 1 pF) is used. From an examination of FIG. 7A, the speed improvement obtained by using the present invention is evident. The current settling time is improved, especially the speed at which the final operating current value is reached in comparison with the prior-art circuit of FIG. 1A in which the asymptotic current behavior is very noticeable. In fact, transistor 10 can approach its steady state condition (point B of FIG. 5) in a more efficient way, without the noticeable asymptotic behavior that characterizes a transistor approaching close to the turn-off transistor condition (point A of FIG. 5). Moreover, close to point B, the transistors have a greater absolute current value and transconductance. As a result, transistor 30, near to its operating point B, drives the capacitance node 20 with a greater strength than in the prior art case in which the operating point A is close to the turn-off condition. The improvement is more evident the larger the size and the lower is the supplied current of the diode-connected transistor in the circuit in which the invention is employed.

Figure 7B:
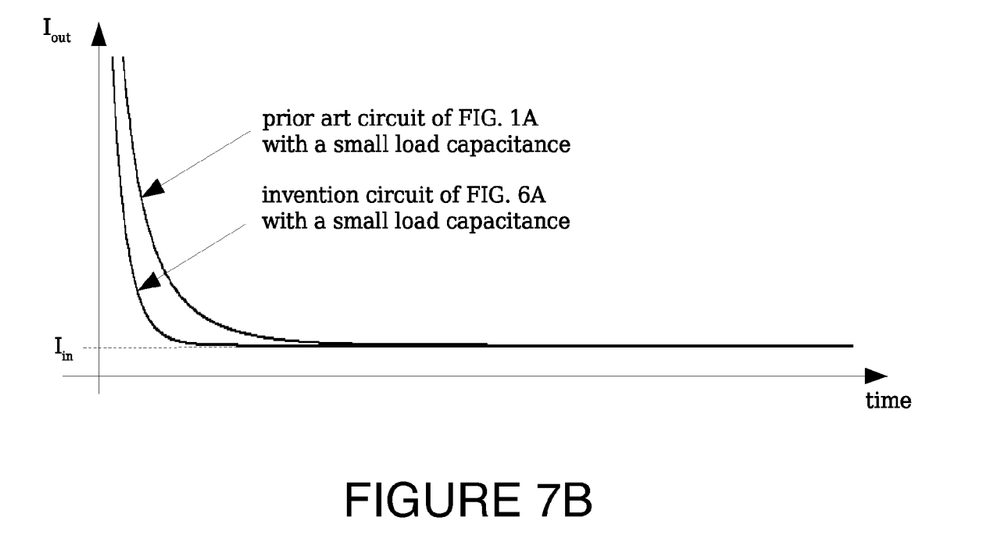

As previously noted, the speed issue is present independently of the value of the load capacitance coupled with the gate of the mirror-connected transistors. In particular, it is also present if the value of capacitance 20 is low. FIG. 7B shows the biasing current improvement also for the case in which the value of capacitance 20 is low (e.g., on the order of 50 fF). Compared with the result shown in FIG. 7A, both current settling times are faster because capacitance 20 is smaller. The biasing current improvement is also evident also for the case shown in FIG. 7B. Persons of ordinary skill in the art will appreciate that similar results are obtained for the n-channel current mirror of FIG. 6B.

Many other current-mirror circuits can be formed by merging the simple p-channel and n-channel current mirrors that were shown in FIGS. 1A and 1B. Any of these other current-mirror circuits which are formed by merging together two or more of these basic circuits is improvable using the concepts of the present invention. For example, the present invention is applicable to the circuits shown in FIGS. 3A and 3B. Both of these circuits are formed from a first p-channel current-mirror followed by a second n-channel current-mirror.

Figure 8A:
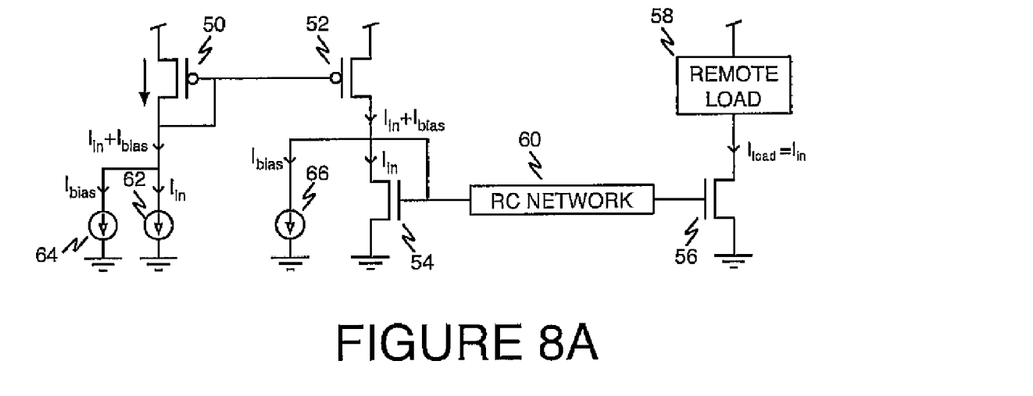
FIGS. 8A through 8C are schematic diagrams of multi-stage current-mirror circuits formed by applying the principles of the present invention to the prior-art circuits of FIGS. 3A, 3B, and 3C.
Figure 8B:
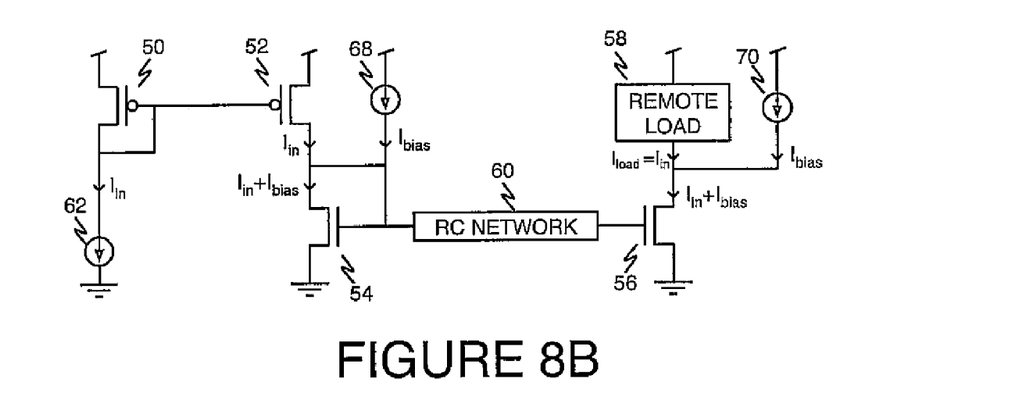
Figure 8C:
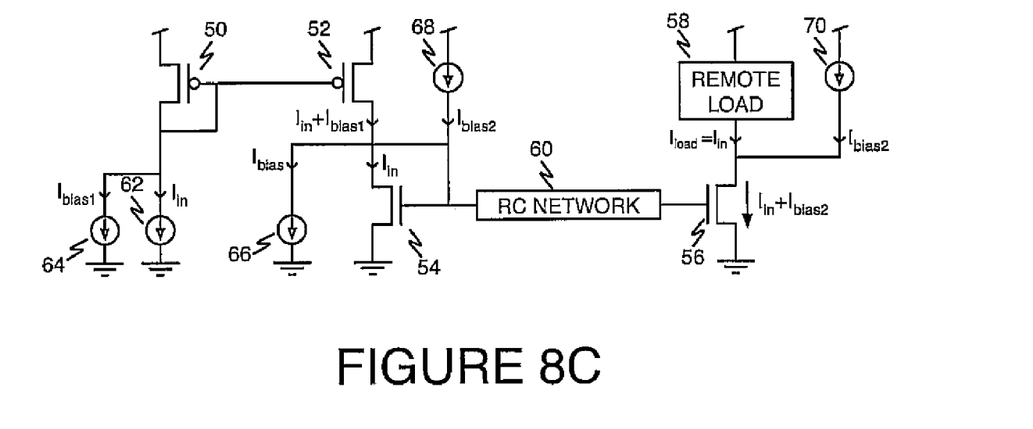

Referring now to FIGS. 8A, 8B, and 8C, current-mirror circuits formed using the principles of the present invention are shown. Certain of the circuit elements are common to FIGS. 8A, 8B, and 8C and will be referred to in each figure by the same reference numerals. In FIG. 8A a current-mirror circuit like that of FIG. 3A is shown with the principles of the present invention applied to the p-channel current mirror only. Thus, a p-channel current-mirror circuit includes diode-connected p-channel transistor 50 and driven transistor 52. Driven p-channel transistor 52 acts as a current source and supplies current to an n-channel current mirror circuit including diode-connected n-channel transistor 54 and driven n-channel transistor 56. Driven n-channel transistor 56 supplies current to remote load 58. The impedance of the line between diode-connected n-channel transistor 54 and driven n-channel transistor 56 is represented as RC network 60.

According to the present invention, the current-mirror circuit of FIG. 8A includes a current source 62 to supply the current $I_{in}$ to diode-connected p-channel transistor 50. An additional current source 64 supplies a current $I_{bias}$ to diode-connected p-channel transistor 50. A current source 66 shunts a current $I_{bias}$ away from diode-connected n-channel transistor 52 in the n-channel current mirror so that it conducts only the current $I_{in}$.

In FIG. 8B a current-mirror circuit like that of FIG. 3A is shown with the principles of the present invention applied to the n-channel current mirror only. As in FIG. 8A, a p-channel current-mirror circuit includes diode-connected p-channel transistor 50 and driven transistor 52. Driven p-channel transistor 52 acts as a current source and supplies current to an n-channel current mirror circuit including diode-connected n-channel transistor 54 and driven n-channel transistor 56. Driven n-channel transistor 56 supplies current to remote load 58. The impedance of the line between diode-connected n-channel transistor 54 and driven n-channel transistor 56 is represented as RC network 60.

According to the present invention, the current-mirror circuit of FIG. 8B includes a current source 62 to supply the current $I_{in}$ to diode-connected p-channel transistor 50. An additional current source 68 in parallel with driven p-channel transistor 52 supplies a current $I_{bias}$ to diode-connected n-channel transistor 54 in addition to the $I_{in}$ current mirrored by driven p-channel transistor 52. A current source 70 shunts a current $I_{bias}$ away from remote load 58 in the n-channel current mirror so that remote load 58 sinks only the current $I_{in}$.

In FIG. 8C a current-mirror circuit like that of FIG. 3A is shown with the principles of the present invention applied to both the p-channel and the n-channel current mirrors. As in FIGS. 8A and 8B, a p-channel current-mirror circuit includes diode-connected p-channel transistor 50 and driven transistor 52. Driven p-channel transistor 52 acts as a current source and supplies current to an n-channel current mirror circuit including diode-connected n-channel transistor 54 and driven n-channel transistor 56. Driven n-channel transistor 56 supplies current to remote load 58. The impedance of the line between diode-connected n-channel transistor 54 and driven n-channel transistor 56 is represented as RC network 60.

According to the present invention, the current-mirror circuit of FIG. 8C includes a current source 62 to supply the current $I_{in}$ to diode-connected p-channel transistor 50. An additional current source 64 supplies a current $I_{bias1}$ to diode-connected p-channel transistor 50. A current source 66 shunts a current $I_{bias1}$ away from diode-connected n-channel transistor 52 in the n-channel current mirror so that it passes only the current $I_{in}$. In addition, current source 68 in parallel with driven p-channel transistor 52 supplies a current $I_{bias2}$ to diode-connected n-channel transistor 54 in addition to the $I_{in}$ current mirrored by driven p-channel transistor 52. A current source 70 shunts a current $I_{bias2}$ away from remote load 58 in the n-channel current mirror so that remote load 58 passes only the current $I_{in}$. Persons of ordinary skill in the art will appreciate that it is not necessary that the bias currents $I_{bias1}$ and $I_{bias2}$ applied to the two current mirrors be equal for the circuit to function correctly as long as current-source pairs 64 with 66 and 68 with 70 are set for the same current.

Figure 9A:
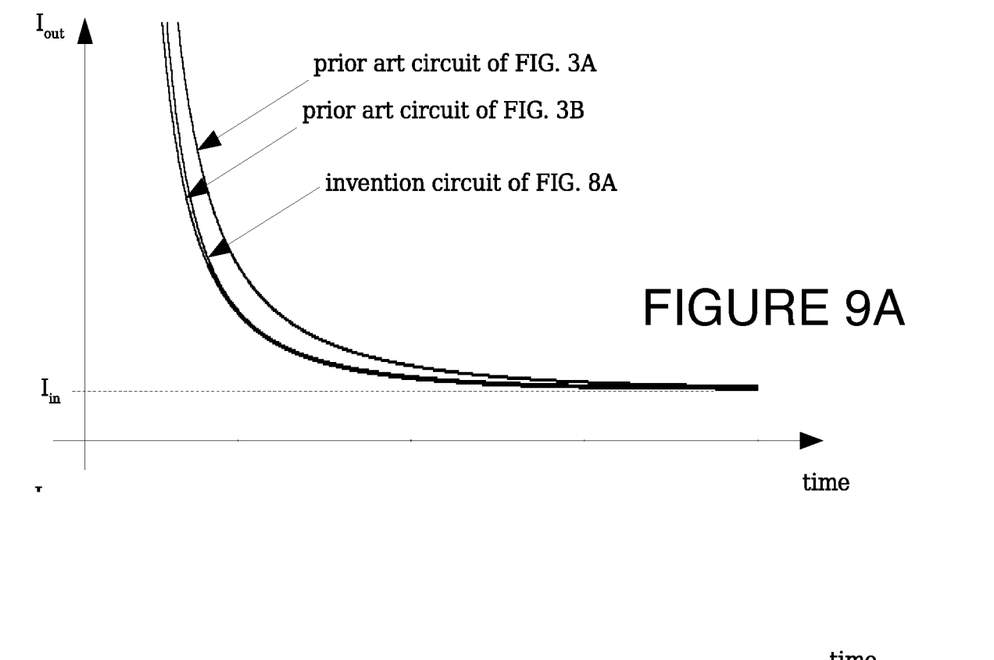
FIGS. 9A through 9C are graphs showing a comparison of the performances of the circuits of FIGS, 8A, 8B, and 8C with the prior-art circuits of FIGS. 3A and 3B.

Referring now to FIGS. 9A, 9B, and 9C, the results obtained using the current-mirror circuit of FIGS. 8A, 8B, and 8C are compared with the results obtained using the prior-art circuits of FIGS. 3A and 3B. In FIG. 9A a fair speed improvement is noticeable with respect to the prior art circuit of FIG. 3A, in fact, applying the invention to the p-channel mirror circuit improves the p-channel transient behavior. This is an interesting result since, from FIG. 9A, it appears evident that the resulting settling time is comparable to that obtained with the prior art circuit of FIG. 3B, but without wasting the chip area by increasing the sizes of the driven p-channel transistor and the diode-connected n-channel transistor as in FIG. 3B. Even if the settling time were greater than that in the prior art case of FIG. 3B, this solution may be significant in order to save chip area.

Figure 9B:
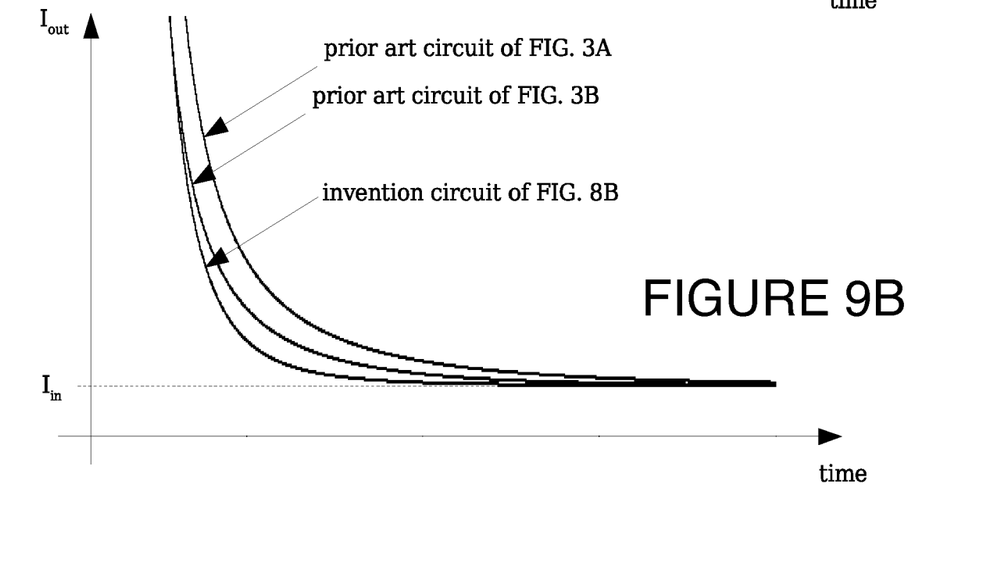

In FIG. 9B, a more significant improvement is noticeable. This is because, in this case, the principles of the present invention are applied to the n-channel current mirror more limited by the capacitance of the diode-connected n-channel transistor (that is, the RC network capacitance).

Figure 9C:
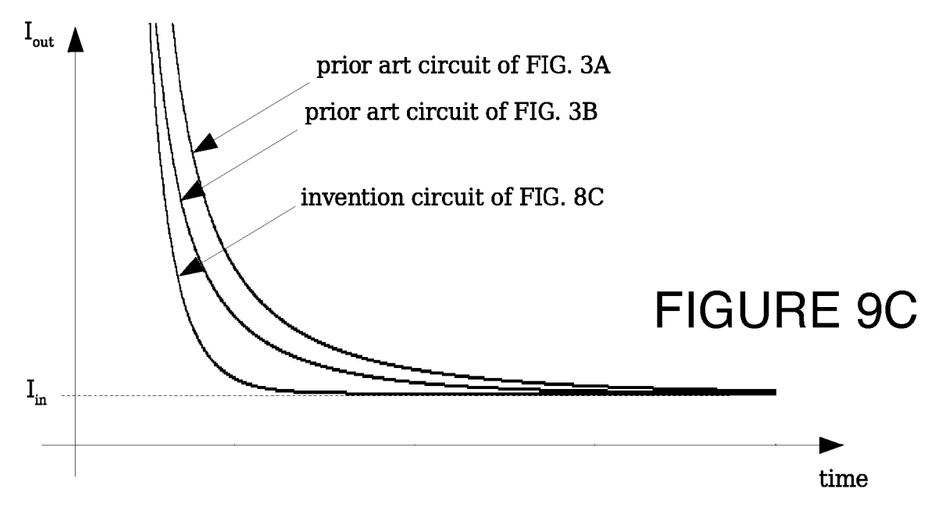

In FIG. 9C, corresponding to the circuit in FIG. 8C where principles of the present invention are applied to the p-channel and the n-channel current mirrors, it may be seen that the result is the best of the three.

Figure 10A:
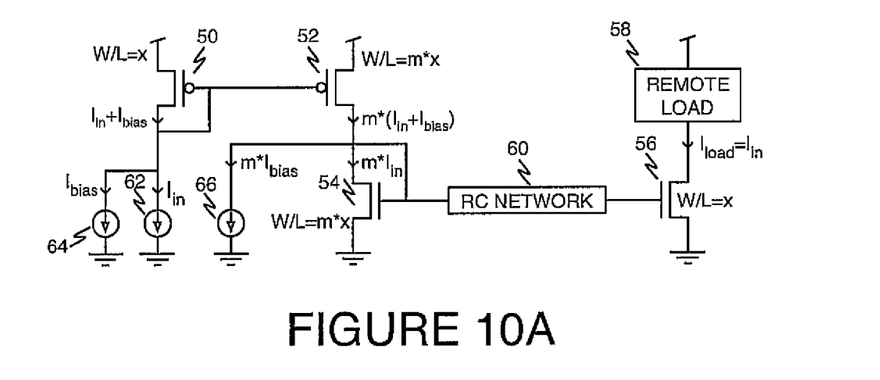
FIGS. 10A through 10C are schematic diagrams of other multi-stage current-mirror circuits formed by applying the principles of the present invention to the prior-art circuits of FIGS. 3A and 3B.
Figure 10B:
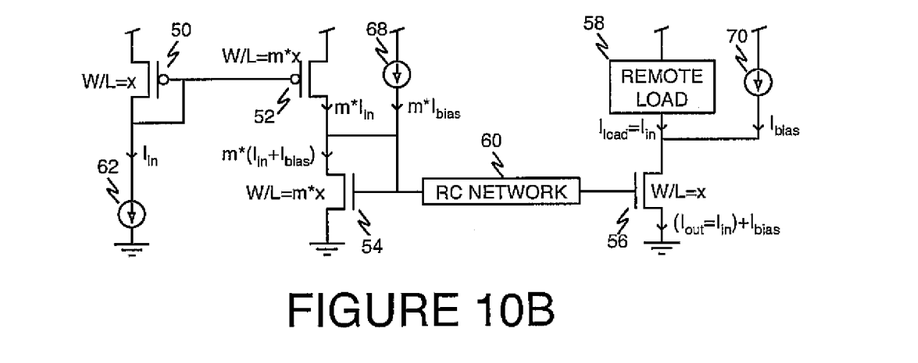
Figure 10C:
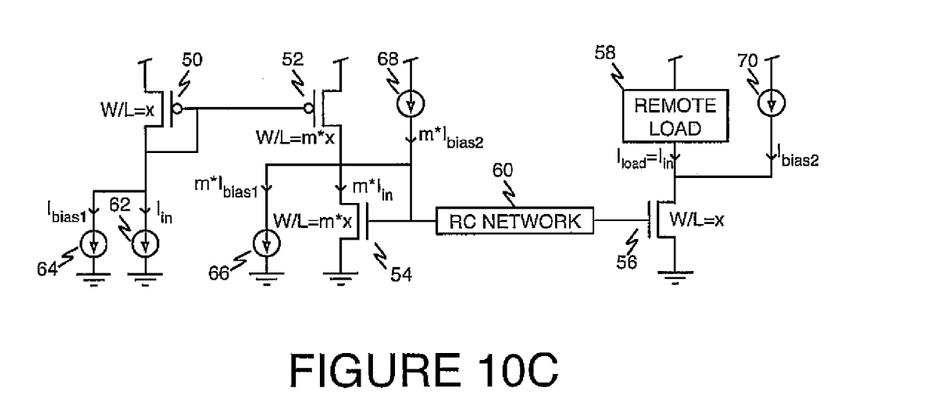

Referring now to FIGS. 10A, 10B, and 10C, three current-mirror circuits formed according to the principles of the present invention are shown. In FIG. 10A a current-mirror circuit like that of FIG. 3B is shown with the principles of the present invention applied to the p-channel current mirror only. In FIG. 10B a current-mirror circuit like that of FIG. 3B is shown with the principles of the present invention applied to the n-channel current mirror only. In FIG. 10C a current-mirror circuit like that of FIG. 3B is shown with the principles of the present invention applied to both the p-channel and the n-channel current mirrors.

The current-mirror circuits of FIGS. 10A, 10B, and 10C are substantially similar to the current mirror circuits shown and disclosed with reference to FIGS. 8A, 8B, and 8C, respectively and operate substantially as disclosed with respect to those circuits, except that in each case driven p-channel transistor 52 and diode-connected n-channel transistor 54 are sized to be m times the size of diode-connected p-channel transistor 50 and driven n-channel transistor 56. Accordingly, the bias current generators 66 and 68 (In this embodiment, for simplicity as mentioned in the paragraph [0030]) have to sink a biasing current m times greater with respect to the biasing current generators 64 and 70, in order to correctly shunt away the biasing current from the load circuit. Referring to the FIG. 10C, different bias currents $I_{bias1}$ and $I_{bias2}$ may be applied to the two current mirrors. As in the embodiment of FIG. 8C, persons of ordinary skill in the art will appreciate that it is not necessary that the bias currents $I_{bias1}$ and $I_{bias2}$ in FIG. 10C applied to the two current mirrors to be equal for the circuit to function correctly as long as current-sources 66 and 68 respectively sink a current m times greater with respect to the current sources 64 and 70.

Figure 11A:
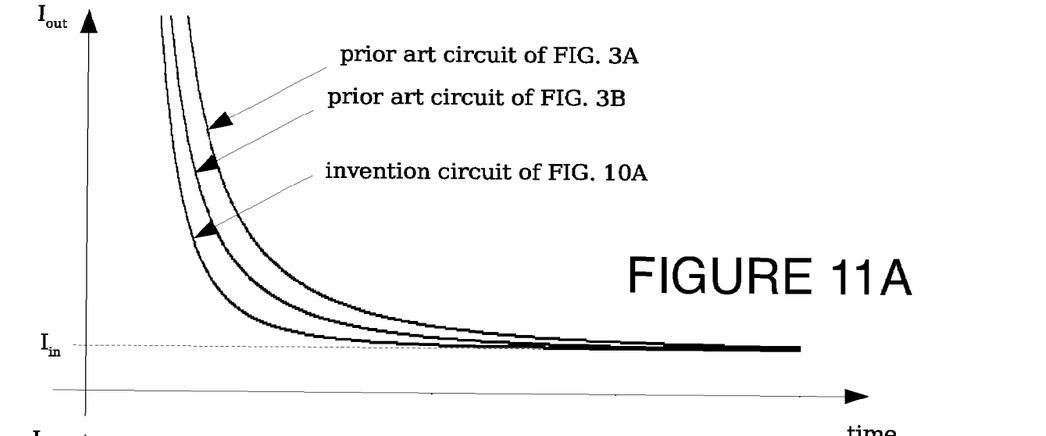
FIGS. 11A through 11C are graphs showing a comparison of the performances of the circuits of FIGS, 10A, 10B, and 10C with the prior-art circuits of FIGS. 3A and 3B.
Figure 11B:
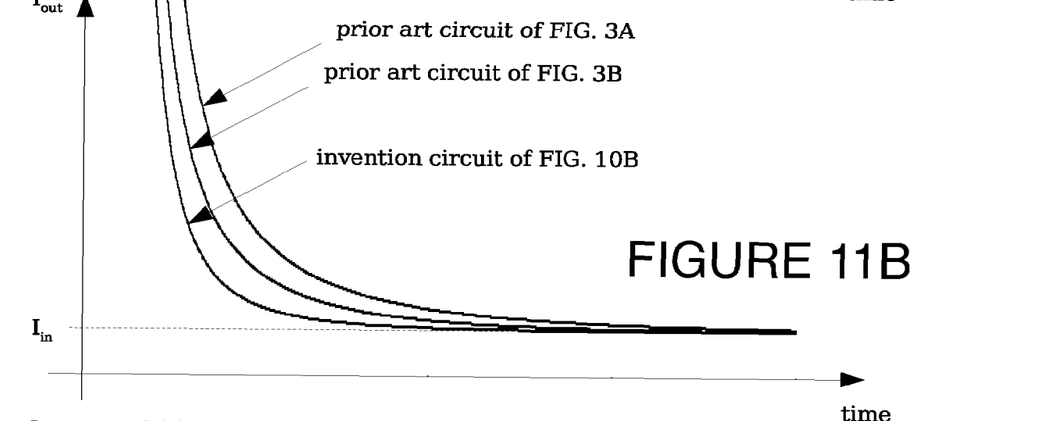
Figure 11C:
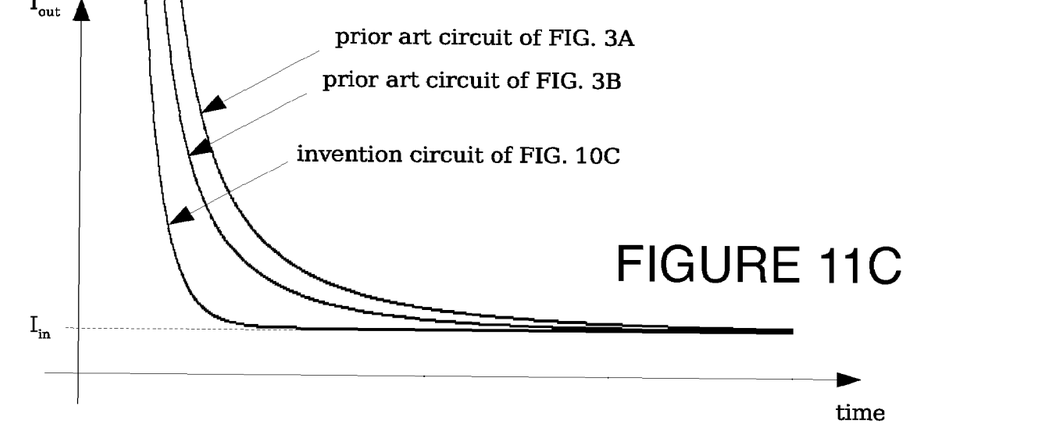

Referring now to FIGS. 11A, 11B, and 11C, the results obtained using the current-mirror circuit of FIGS. 10A, 10B, and 10C are compared with the results obtained using the circuits of FIGS. 3A and 3B. As previously mentioned, when the size of driven p-channel transistor 52 is multiplied by m, the capacitance on the gate node is greater than that of the circuit of FIG. 3A. For this reasons, as shown in the FIG. 8A, a bias current applied to the diode-connected transistor 50 will give a better speed improvement with respect to that obtained by the circuit of FIG. 11A. In FIG. 11B, the output current settling time in the case in which the principles of the present invention are applied only to the n-channel current mirror is comparable with the result of the circuit of FIG. 10A because the improvement due to the bias current $I_{bias}$ is limited by the greater capacitance on the driven p-channel transistor due to its larger size, which is not compensated by any biasing current. The last case shown in FIG. 11C, results in the best speed improvement due to the fact that both the p-channel and n-channel current mirror circuits are compensated by the biasing current.

In conclusion, the present invention allows improvement of the speed performance of many kinds of mirror circuits including one or more basic mirror circuits by applying its principles to one or more basic mirror stages. The more stages to which the invention is applied, the better the global speed improvement. Moreover, the above examples show how it is useful to implement this invention, in particular, when the best speed performance must be obtained together with a minimal chip area. Persons of ordinary skill in the art will appreciate that the present invention is not limited to current-mirror circuits employing any type of transistors including bipolar junction transistors, jfets, etc.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A current-mirror circuit including:
a first current-mirror stage including a diode-connected current-mirror transistor of a first conductivity type driven by a current source coupled to a driven current-mirror transistor of the first conductivity type;
a second current-mirror stage including a diode-connected current-mirror transistor of a second conductivity type driven by current through the driven current-mirror transistor of the first conductivity type and coupled to a driven current-mirror transistor of the second conductivity type;
a load coupled to the driven current-mirror transistor of the second conductivity type;
a first bias current source coupled to the diode-connected current-mirror transistor of the first conductivity type to cause a bias current to flow through the diode-connected current-mirror transistor of the first conductivity type; and
a second bias current source coupled to one of the diode-connected current-mirror transistor of a second conductivity type and the driven current-mirror transistor of a second conductivity type so as to subtract the bias current from current flowing in the load.

2. The current-mirror circuit of claim 1 wherein the first conductivity type is p-type and the second conductivity type is n-type.

3. The current-minor circuit of claim 1 wherein the first conductivity type is n-type and the second conductivity type is p-type.

4. The current-mirror circuit of claim 1 wherein the second bias current source is coupled to the diode-connected current-mirror transistor of a second conductivity type and in parallel with the driven current-mirror transistor of the first conductivity type to shunt the bias current away from the driven current-mirror transistor of the first conductivity type.

5. The current-mirror circuit of claim 1 wherein the second bias current source is coupled to the driven current-mirror transistor of a second conductivity type and in parallel with the load to shunt the bias current away from the load.

6. A current-mirror circuit including:
a first current-mirror stage including a diode-connected current-mirror transistor of a first conductivity type driven by a current source coupled to a driven current-mirror transistor of the first conductivity type;
a second current-mirror stage including a diode-connected current-mirror transistor of a second conductivity type driven by current through the driven current-mirror transistor of the first conductivity type and coupled to a driven current-mirror transistor of the second conductivity type;
a load coupled to the driven current-mirror transistor of the second conductivity type;
a first bias current source coupled to the diode-connected current-mirror transistor of the first conductivity type to cause a first bias current to flow through the diode-connected current-mirror transistor of the first conductivity type;

a second bias current source coupled to the diode-connected current-mirror transistor of a second conductivity type and in parallel with the driven current-mirror transistor of the first conductivity type to shunt the first bias current away from the driven current-mirror transistor of the first conductivity type;

a third bias current source coupled to the diode-connected current-mirror transistor of the second conductivity type to cause a second bias current to flow through the diode-connected current-mirror transistor of the second conductivity type; and a fourth bias current source coupled to the driven current-mirror transistor of a second conductivity type and in parallel with the load to shunt the second bias current away from the load.

7. The current-mirror circuit of claim 6 wherein the first conductivity type is p-type and the second conductivity type is n-type.

8. The current-mirror circuit of claim 6 wherein the first conductivity type is n-type and the second conductivity type is p-type.

9. The current-mirror circuit of claim 6 wherein the first bias current is equal to the second bias current.

10. The current-mirror circuit of claim 6 wherein the first bias current is different from the second bias current.

11. The current-mirror circuit of claim 6 wherein the sizes of the driven current-mirror transistor of the first conductivity type and the diode-connected current-mirror transistor of the second conductivity type are equal to a multiple of the sizes of the diode-connected current-mirror transistor of the first conductivity type and the driven current-mirror transistor of a second conductivity type.

12. The current-mirror circuit of claim 6 wherein:
the W/L of the driven current-mirror transistor of a first conductivity type is m times the W/L of the diode-connected current-mirror transistor of a first conductivity type driven by a current source coupled to a driven current-mirror transistor of the first conductivity type;
the W/L of the diode-connected current-mirror transistor of a second conductivity type is m times the W/L of the driven current-mirror transistor of a second conductivity type; and
the currents sourced by the second bias current source and the third bias current source are m times the currents sourced by the first bias current source and the fourth bias current source.

13. A method of operating a current mirror circuit including a first current-mirror stage including a diode-connected current-mirror transistor of a first conductivity type passing an input current and coupled to a driven current-mirror transistor of the first conductivity type, a second current-mirror stage including a diode-connected current-mirror transistor of a second conductivity type driven by current through the driven current-mirror transistor of the first conductivity type and coupled to a driven current-mirror transistor of the second conductivity type, and a load coupled to the driven current-mirror transistor of the second conductivity type, the method including:
causing a bias current to flow in the diode-connected transistor of the first conductivity type; and
subtracting the bias current from one of the current flowing from the driven transistor of the first conductivity type into the diode-connected transistor of the first conductivity type and the current flowing from the driven transistor of the second conductivity type into the load.

14. The method of claim 13 wherein subtracting the bias current from one of the current flowing from the driven transistor of the first conductivity type into the diode-connected transistor of the first conductivity type and the current flowing from the driven transistor of the second conductivity type into the load comprises subtracting the bias current from the current flowing from the driven transistor of the first conductivity type into the diode-connected transistor of the first conductivity type.

15. The method of claim 14 further including;
causing a second bias current to flow in the diode-connected transistor of the second conductivity type; and
subtracting the second bias current from the current flowing from the driven transistor of the second conductivity type into the load.

16. The method of claim 13 wherein subtracting the bias current from one of the current flowing from the driven transistor of the first conductivity type into the diode-connected transistor of the first conductivity type and the current flowing from the driven transistor of the second conductivity type into the load comprises subtracting the bias current from the current flowing from the driven transistor of the second conductivity type into the load.

17. The method of claim 16 further including;
causing a second bias current to flow in the diode-connected transistor of the second conductivity type; and
subtracting the second bias current from the current flowing from the driven transistor of the second conductivity type into the load.

18. An apparatus, comprising:
a first diode-connected current-mirror transistor coupled to an input current source, a first bias source to provide a bias current, and a first driven current-mirror transistor to form a first current-mirror stage; and
a second current-mirror stage comprising a second diode-connected current-mirror transistor to be driven by current through the first driven current-mirror transistor, a second driven current-mirror transistor to be coupled to a load, and a second bias current source coupled to one of the second diode-connected current-mirror transistor or the second driven current- mirror transistor to subtract the bias current from a current flowing in the load.

19. The apparatus of claim 18, wherein a size of the first driven current-mirror transistor is larger by multiple times a size of the first diode-connected current-mirror transistor.

20. The apparatus of claim 18, wherein a size of the second diode-connected current- mirror transistor is larger by multiple times a size of the second driven current-mirror transistor.

21. A method, comprising:
causing a bias current to flow in a first diode-connected current-mirror transistor coupled to an input current source and a first driven current-mirror transistor to form a first current-mirror stage; and
subtracting the bias current from one of a current flowing from the first driven current- mirror transistor into the first diode-connected current-minor transistor or a current flowing from a second driven current-mirror transistor into a load, wherein the load is coupled to the second driven current-mirror transistor forming part of a second current-mirror stage comprising a second diode-connected current-mirror transistor to be driven by current through the first driven current-mirror transistor, and a bias current source to provide the bias current, the bias current source coupled to one of the second diode-connected current-mirror transistor or the second driven current-mirror transistor.

22. The method of claim 21, wherein the bias current source comprises a first bias current source, and wherein the subtracting comprises:
   shunting the bias current around the load using a second bias current source coupled in parallel with the load.

23. The method of claim 21, wherein the bias current comprises a first bias current, further comprising:
   causing a second bias current to flow in the second diode-connected current-mirror transistor; and
   subtracting the second bias current from the current flowing from the second driven current-mirror transistor into the load.

* * * * *